(12) United States Patent
Stockstad

(10) Patent No.: US 6,870,422 B2
(45) Date of Patent: Mar. 22, 2005

(54) LOW VOLTAGE RAIL-TO-RAIL CMOS INPUT STAGE

(75) Inventor: Troy L. Stockstad, Chandler, AZ (US)

(73) Assignee: Standard Microsystems Corporation, Hauppauge, NY (US)

(*) Notice: Subject to any disclaimer, the term of this patent is extended or adjusted under 35 U.S.C. 154(b) by 88 days.

(21) Appl. No.: 10/013,581

(22) Filed: Dec. 10, 2001

(65) Prior Publication Data

US 2002/0053948 A1 May 9, 2002

Related U.S. Application Data

(63) Continuation of application No. 09/516,008, filed on Feb. 29, 2000, now Pat. No. 6,366,167.

(51) Int. Cl.[7] ................................................. H03F 3/45
(52) U.S. Cl. ........................................ 330/253; 330/261
(58) Field of Search ................................. 330/253, 255, 330/261

(56) References Cited

U.S. PATENT DOCUMENTS

| | | | |
|---|---|---|---|
| 4,087,759 A | 5/1978 | Iwamatsu | 330/262 |
| 4,335,355 A | 6/1982 | Haque | 330/253 |
| 4,808,944 A * | 2/1989 | Taylor | 330/253 |
| 4,879,524 A | 11/1989 | Bell | 330/288 |
| 5,287,071 A * | 2/1994 | Olmstead et al. | 330/258 |
| 5,343,163 A * | 8/1994 | Linder et al. | 330/252 |
| 5,598,117 A * | 1/1997 | Deguchi | 327/103 |
| 5,606,287 A | 2/1997 | Kobayahi et al. | 330/255 |
| 5,799,051 A * | 8/1998 | Leung et al. | 327/287 |
| 5,889,433 A | 3/1999 | Honma | 330/273 |
| 5,894,236 A | 4/1999 | Mizoguchi et al. | 327/108 |
| 6,060,940 A | 5/2000 | Chiozzi | 327/437 |
| 6,118,341 A * | 9/2000 | Huijsing et al. | 330/253 |
| 6,121,839 A | 9/2000 | Giacomini | 330/264 |
| 6,194,962 B1 * | 2/2001 | Chen | 330/253 |
| 6,222,394 B1 * | 4/2001 | Allen et al. | 327/52 |

FOREIGN PATENT DOCUMENTS

JP 08037431 * 2/1996 ............. H03F/3/45

* cited by examiner

Primary Examiner—Khanh V. Nguyen
(74) Attorney, Agent, or Firm—Perkins Coie LLP

(57) ABSTRACT

The present invention discloses a low voltage rail-to-rail CMOS input stage. The input stage includes a differential pail of P-channel metal oxide semiconductor field effect (PMOS) transistors, which produces differential output current signal. The input stage further includes a pair of N-channel depletion-mode metal oxide semiconductor field effect (NMOS) transistors, coupled to the bulk terminals of the differential pair of PMOS transistors, for receiving an input signal. The depletion-mode NMOS transistors further act as source follower devices to drive the bulk terminals of the differential pair of PMOS transistors.

37 Claims, 5 Drawing Sheets

LOW VOLTAGE RAIL-TO-RAIL CMOS INPUT STAGE

CROSS REFERENCE TO RELATED APPLICATIONS

This application is a Continuation of U.S. patent application Ser. No. 9/516,008 entitled LOW VOLTAGE RAIL-TO-RAIL CMOS INPUT STAGE, filed on Feb. 29, 2000 now U.S. Pat. No. 6,366,167. This application is related to co-pending U.S. patent application Ser. No. 9/515,961 entitled LOW VOLTAGE RAIL-TO-RAIL CMOS OUTPUT STAGE, filed on an even day herewith on behalf of Troy L. Stockstad, the disclosure of which is incorporated herein by reference.

BACKGROUND OF THE INVENTION

The present invention relates generally to integrated circuits and, more particularly to amplifiers having a low voltage CMOS differential amplifier input stage.

Today, electronic systems encompassing operational amplifiers generally have lower operating voltage supplies than they have in the past, mainly do to low power battery sources. Moreover, power supply voltages requirements continue to decrease, while dynamic range requirements remain essentially constant. Fortunately, various manufacturing processes for integrated circuits make it possible to create rail-to-rail differential input stages.

Although the various types of input stages operate from a single supply voltage source, the low voltage limit for amplifier operation differs for each type of input stage and each integrated circuit manufacturing process. Present op amp input stage designs exhibit voltage operation limits that hinder their application in products powered by batteries having an end life of near one volt. For example, an op amp using complimentary bipolar transistor differential pairs amplifying signals near positive and negative supplies has low operating voltage limitations imposed by standard transistor base to emitter voltage drops.

One conventional solution for rail-to-rail input stages has been the use of depletion-mode MOSFETs to provide amplification of the differential input. FIG. 1 is a schematic diagram showing a prior art input stage 100 for a low voltage operational amplifier. The input stage 100 includes a differential input signal $V_{IN}$ coupled to the gates of two N-channel depletion-mode MOSFETs 2 and 4. The drain of MOSFET 2 is coupled to one terminal of current source 6, and the drain of MOSFET 4 is coupled to one terminal of current source 8. The second terminals for both current sources 6 and 8 are coupled to operating potential $V_{CC}$. Both source terminals of MOSFETs 2 and 4 are coupled to one terminal of current sink 10, while the other terminal of current sink 10 is coupled to ground reference. The bulk, or well, terminals of both MOSFET 2 and MOSFET 4 are also coupled to the ground reference.

The differential pair of MOSFETs 2 and 4 receives the input signal $V_{IN}$ and provides a differential output current from the drain terminals of MOSFETs 2 and 4 at inputs 14 and 16 to the rest of the system. While the prior art input stage 100 provides an input transconductance, input stage 100 has limited uses. For example, input stage 100 requires the input NMOS transistors 2 and 4 to have a particular combination of threshold voltage and bulk concentration to have proper common mode range and function correctly. This causes the process requirements for input stage 100 to be strictly defined so that the common mode input range is maximized.

In view of the forgoing, what is needed is a versatile operational amplifier input stage that can be used in a variety of applications powered from battery sources. In addition, the amplifier input stage should allow near rail-to-rail performance and increased design flexibility over that provided by prior art input stages.

SUMMARY OF THE INVENTION

The present invention addresses these needs by providing a low voltage rail-to-rail CMOS input stage. In one embodiment, a low voltage operational amplifier input stage is disclosed. The input stage includes a differential pair of P-channel metal oxide semiconductor field effect (PMOS) transistors, which produces a differential current. The input stage further includes two N-channel depletion-mode metal oxide semiconductor field effect (NMOS) transistors, coupled to the bulk terminals of the differential pair of PMOS transistors, for receiving an input signal. The depletion-mode NMOS transistors further act as source follower devices to drive the bulk terminals of the differential pair of PMOS transistors.

In another embodiment, a method for providing an output signal from an input stage of a low voltage operational amplifier is disclosed. The method includes providing an input signal to two NMOS transistors coupled to bulk terminals of a differential pair of PMOS transistors. The method further includes providing first and second alternating current signals using the differential pair of PMOS transistors.

An application specific integrated circuit (ASIC) having an input stage for a low voltage operational amplifier input stage is disclosed. The ASIC includes a differential pair of P-channel metal oxide semiconductor field effect (PMOS) transistors, which produces a differential output current. The ASIC further includes two N-channel depletion-mode metal oxide semiconductor field effect (NMOS) transistors, coupled to the bulk terminals of the pair of PMOS transistors, for receiving an input signal. The depletion-mode NMOS transistors further act as source follower devices to drive the bulk terminals of the differential pair of PMOS transistors.

In yet another embodiment, a low voltage operational amplifier input stage is disclosed. The input stage includes a differential pair of NMOS transistors, which produces a differential current. The input stage further includes two depletion-mode PMOS transistors coupled to the bulk terminals of the differential pair of NMOS transistors, for receiving an input signal. The depletion-mode PMOS transistors further act as source follower devices to drive the bulk terminals of the differential pair of NMOS transistors.

In a still further embodiment, a low voltage operational amplifier input stage is disclosed. The input stage includes a differential pair of NMOS transistors, which produces a differential current. The input stage further includes two JFET transistors coupled to the bulk terminals of the differential pair of NMOS transistors, for receiving an input signal. The JFET transistors further act as source follower devices to drive the bulk terminals of the differential pair of NMOS transistors.

Advantageously, the present invention provides a versatile operational amplifier input stage that can be used in a variety of applications, including applications powered by low power battery sources. Moreover, the input stage of the present invention provides essentially rail-to-rail performance and increased design flexibility over that provided by conventional input stages.

DETAILED DESCRIPTION OF THE INVENTION

An invention is disclosed for a low voltage rail-to-rail CMOS input stage. In the following description, numerous specific details are set forth in order to provide a thorough understanding of the present invention. It will be apparent, however, to one skilled in the art, that the present invention may be practiced without some or all of these specific details. In other instances, well known process steps and devices have not been described in detail in order not to unnecessarily obscure the present invention.

Figure 1:
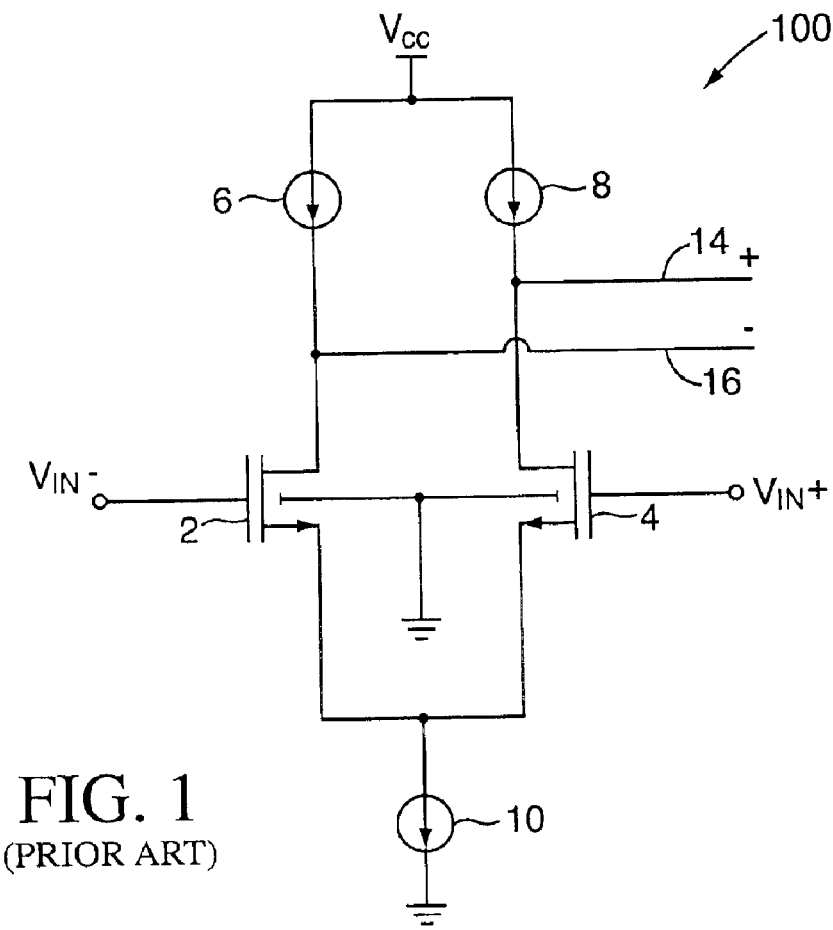
FIG. 1 is a schematic diagram showing a prior art input stage for a low voltage operational amplifier.
Figure 2:
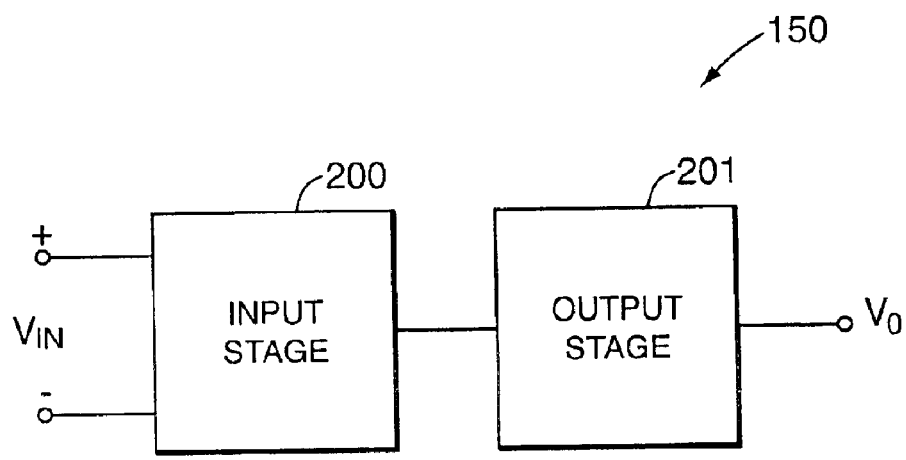
FIG. 2 is a block diagram showing an operational amplifier, in accordance with one embodiment of the present invention.

FIG. 1 has been described in terms of the prior art. FIG. 2 is a block diagram showing an operational amplifier 150, in accordance with one embodiment of the present invention. The operational amplifier 150 includes an input stage 200 and an output stage 201.

In operation, the input stage 200 receives a differential input signal $V_{IN}$. The input stage 200 then converts the differential input signal to an output signal and supplies the output signal to the output stage 201. The output stage 201 receives the input stage output signal and converts it to an amplified output voltage $V_O$.

The output stage 201 provides essential rail-to-rail performance, and is capable of operating with a voltage supply as low as slightly more than a single $V_{GS}$ voltage. As described in greater detail subsequently, the use of an output sink and source network by the output stage 201 allows this functionality.

Figure 3:
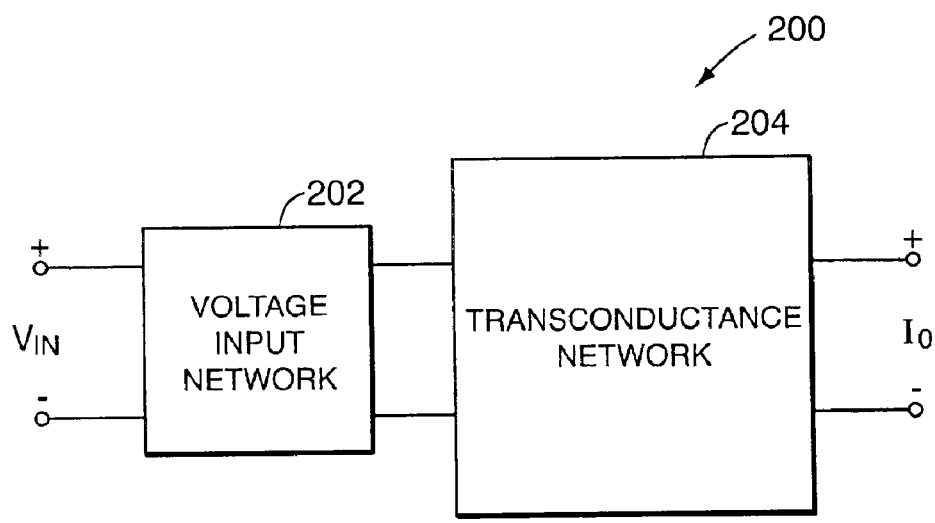
FIG. 3 is a block diagram showing an input stage, in accordance with an embodiment of the present invention.

FIG. 3 is a block diagram showing an input stage 200, in accordance with an embodiment of the present invention. The input stage 200 includes a voltage input network 202 and transconductance network 204 coupled to the voltage input network 202. The voltage input network 202 receives a differential input signal $V_{IN}$, while the transconductance network 204 provides differential current $I_0$ to the rest of the system, such as to an operational amplifier.

It is desirable to generate a current based on the differential input voltage over the entire common-mode range of the amplifier, including $V_{CC}$ and $V_{EE}$. Thus, in operation, input stage 200 provides current for rail-to-rail operation at low voltage, as is often required by low power battery sources. Conventional transconductance networks generally have a limited input common mode voltage range over which they can generate current, which does not include $V_{CC}$ and $V_{EE}$. However, the present invention allows essentially full rail-to-rail performance because the voltage input network 202 allows the transconductance network 204 to generate current over a voltage range of essentially from $V_{EE}$ to $V_{CC}$.

Figure 4:
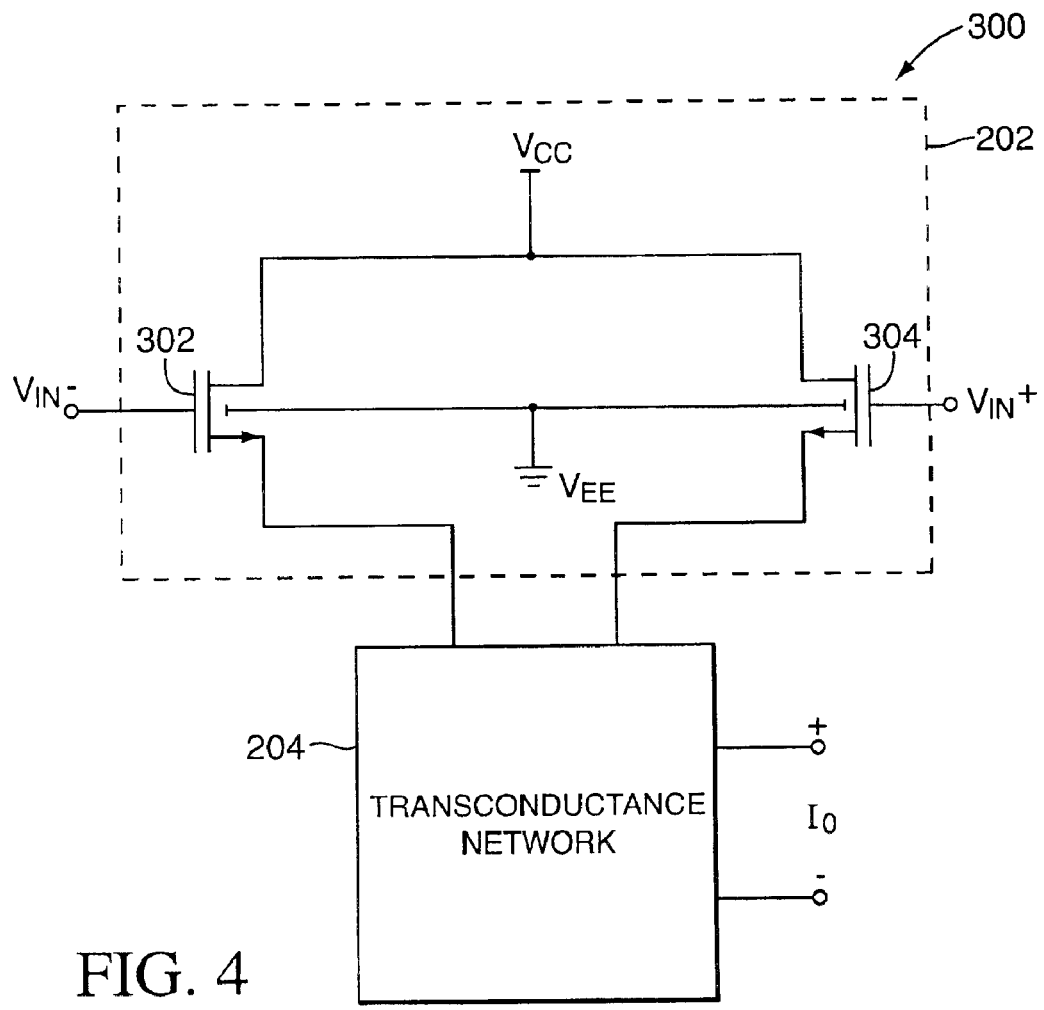
FIG. 4 is a schematic diagram showing an input stage in accordance with another embodiment of the present invention.

FIG. 4 is a schematic diagram showing an input stage 300 in accordance with another embodiment of the present invention. The input stage 300 includes a voltage input network 202 and a transconductance network 204. The voltage input network 202 includes depletion-mode NMOS transistor 302 and depletion-mode NMOS transistor 304. The drains of depletion-mode NMOS transistors 302 and 304 are coupled to $V_{CC}$ and the sources of depletion-mode NMOS transistors 302 and 304 are coupled to the transconductance network 204. Finally, the differential input signal $V_{IN}$ is provided to the voltage input network 202 through the gates of depletion-mode NMOS transistors 302 and 304.

In use, the depletion-mode NMOS transistors 302 and 304 are used as source follower devices to drive the transconductance current network 204. Advantageously, the depletion-mode NMOS transistors 302 and 304 have a source potential greater than $V_{EE}$ when their gate voltages are equal to $V_{EE}$. Moreover, when the gate voltage of the depletion-mode NMOS transistors 302 and 304 transitions to near $V_{CC}$, the back-gate effect on these transistors causes the threshold to become positive, thus making the source voltage less than the gate voltage. As described in greater detail subsequently, this property of the depletion-mode NMOS transistors 302 and 304 allows the input stage of the present invention to operate over a common mode voltage range, which includes $V_{CC}$ and $V_{EE}$.

Figure 5:
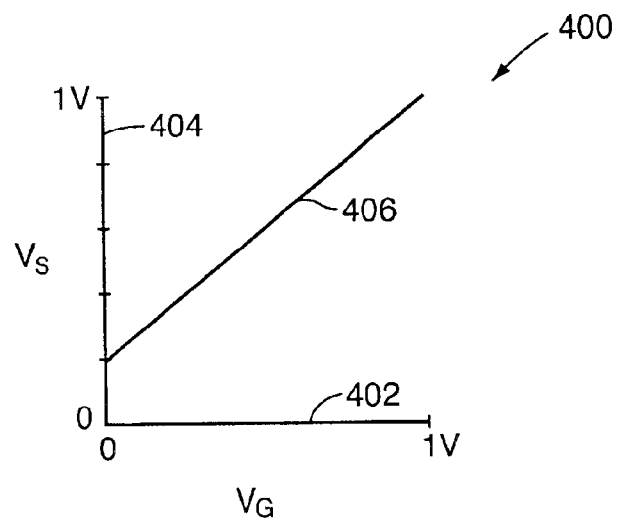
FIG. 5 is graph showing a plot of the source voltage vs. the gate voltage of a depletion-mode NMOS transistor, in accordance with an embodiment of the present invention.

FIG. 5 is graph 400 showing a plot of the source voltage vs. the gate voltage of a depletion-mode NMOS transistor, in accordance with an embodiment of the present invention. The graph 400 includes a voltage-gate axis 402, a voltage-source axis 404, and a plot of the source voltage 406 in relation to the gate voltage. As shown by graph 400, when the gate voltage is at $V_{EE}$, the source voltage is positive, at about 200 mV, and when the gate voltage is at 1 V, the source voltage is about 900 mV. Thus, the source range for the depletion-mode NMOS transistors of the present invention is about 200 mV to 900 mV, which allows these devices to drive the bulk terminals of PMOS transistors, as described in greater detail subsequently. Essentially, the depletion mode NMOS transistors compress the full scale input voltage to a range within the supply voltages $V_{CC}$ and $V_{EE}$.

Depletion-mode NMOS transistors are generally built on a silicon substrate having four terminals represented as gate, drain, source, and bulk. A processing mask layer defines the region for implanting N-type doping material, such as arsenic, into the silicon to form source and drain regions. The MOS gate region is also defined by a processing mask layer such that the gate conductor and gate oxide physically separate the source and drain regions. N-channel source and drain regions are confined within a well region for receiving a p-type material implant, such as boron. The background concentration of the well region determines the back gate effect, which controls the change in the threshold voltage determined by the source to bulk voltage. Low resistance conducting materials, such as aluminum metal, provide electrical connections to the gate terminal, source terminal, drain terminal, and the bulk terminal.

Figure 6A:
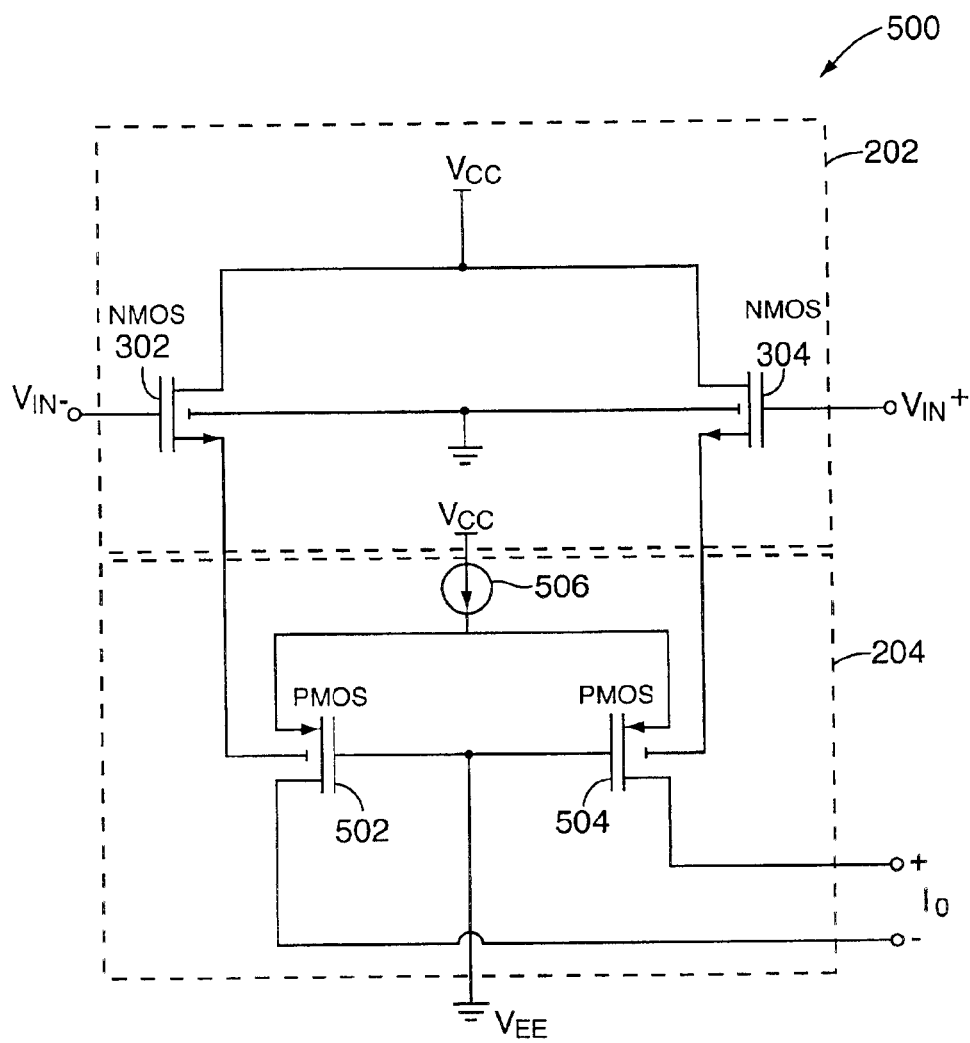
FIG. 6A is a schematic diagram of a low voltage rail-to-rail CMOS input stage, in accordance with one embodiment of the present invention.

FIG. 6A is a schematic diagram of a low voltage rail-to-rail CMOS input stage 500, in accordance with one embodiment of the present invention. The input stage 500 includes a voltage input network 202 and a transconductance network 204. The voltage input network 202 includes depletion-mode NMOS transistor 302 and depletion-mode NMOS transistor 304. The drains of depletion-mode NMOS transistors 302 and 304 are coupled to $V_{CC}$ and the sources of depletion-mode NMOS transistors 302 and 304 are coupled to the transconductance network 204. Finally, the differential input signal $V_{IN}$ is provided to the voltage input network 202 through the gates of depletion-mode NMOS transistors 302 and 304.

In use, the depletion-mode NMOS transistors 302 and 304 are used as source follower devices to drive the transconductance network 204. Advantageously, the depletion-mode NMOS transistors 302 and 304 have a source potential greater than $V_{EE}$ when their gate voltages are equal to $V_{EE}$. Moreover, when the gate voltage the depletion-mode NMOS transistors 302 and 304 transitions to near $V_{CC}$, the back-gate effect on these transistors causes their threshold voltages to become positive, thus making their source voltages less than their gate voltages. This property of the depletion-mode NMOS transistors 302 and 304 allows the input stage of the present invention to operate at essentially rail-to-rail.

The transconductance network 204 includes a differential PMOS transistor pair 502 and 504. The gates of PMOS transistors 502 and 504 are coupled to the ground reference $V_{EE}$, and the sources of PMOS transistors 502 and 504, are coupled to current source 506. The drains of PMOS transistors 502 and 504 provide a differential output $I_O$ to the rest of the system, such as to an operational amplifier. Finally, the bulk terminal of PMOS transistor 502 is coupled to the source of depletion-mode NMOS transistor 302, and the bulk terminal of PMOS transistor 504 is coupled to the source of depletion-mode NMOS transistor 304.

Essentially, it is desirable to generate a current based on a differential input voltage over the entire common-mode range of the amplifier, including $V_{CC}$ and $V_{EE}$. The present invention addresses this by driving the bulk terminals of the differential pair PMOS transistors 502 and 504, and coupling their gates to the ground reference. Thus, in operation, the depletion-mode NMOS transistors 302 and 304 are utilized as source follower devices to drive the bulk terminals of PMOS transistors 502 and 504. By modulating the bulk voltages of PMOS transistors 502 and 504 via the source follower NMOS transistors 302 and 304, the channels of transistors 502 and 504 are sufficiently modulated to generate an input transconductance for the amplifier.

The bulk terminals of transistors 502 and 504 can be treated as another gate input to the PMOS transistor, thus, allowing the present invention to operate over the entire input common-mode range of $V_{CC}$ to $V_{EE}$. In the present invention, the range of voltages over which a current can be generated matches the input ranges of the depletion-mode transistors.

Since the bulk terminals of NMOS transistors 302 and 304 are coupled to $V_{EE}$, when the gate voltage of these transistors is at $V_{EE}$ the source voltage will be positive (i.e., above the gate). Moreover, when the gate voltage transistors 302 and 304 transitions to near $V_{CC}$, the back-gate effect on these transistors causes their threshold voltages to become positive, thus making their source voltages less than their gate voltages, as discussed previously with reference to FIG. 5.

These depletion-mode devices are primarily used for a voltage level shifter in the present invention, rather than to control the transconductance. This allows for greater flexibility than is possible with prior art configurations. For example, the devices may have different sizes and thus have a different transconductance without effecting the bandwidth of the operational amplifier. This is because the current in the differential pair transistors 502 and 504, and the size of these devices, set the bandwidth of the operational amplifier, along with the compensation network in output stage 201.

Figure 6B:
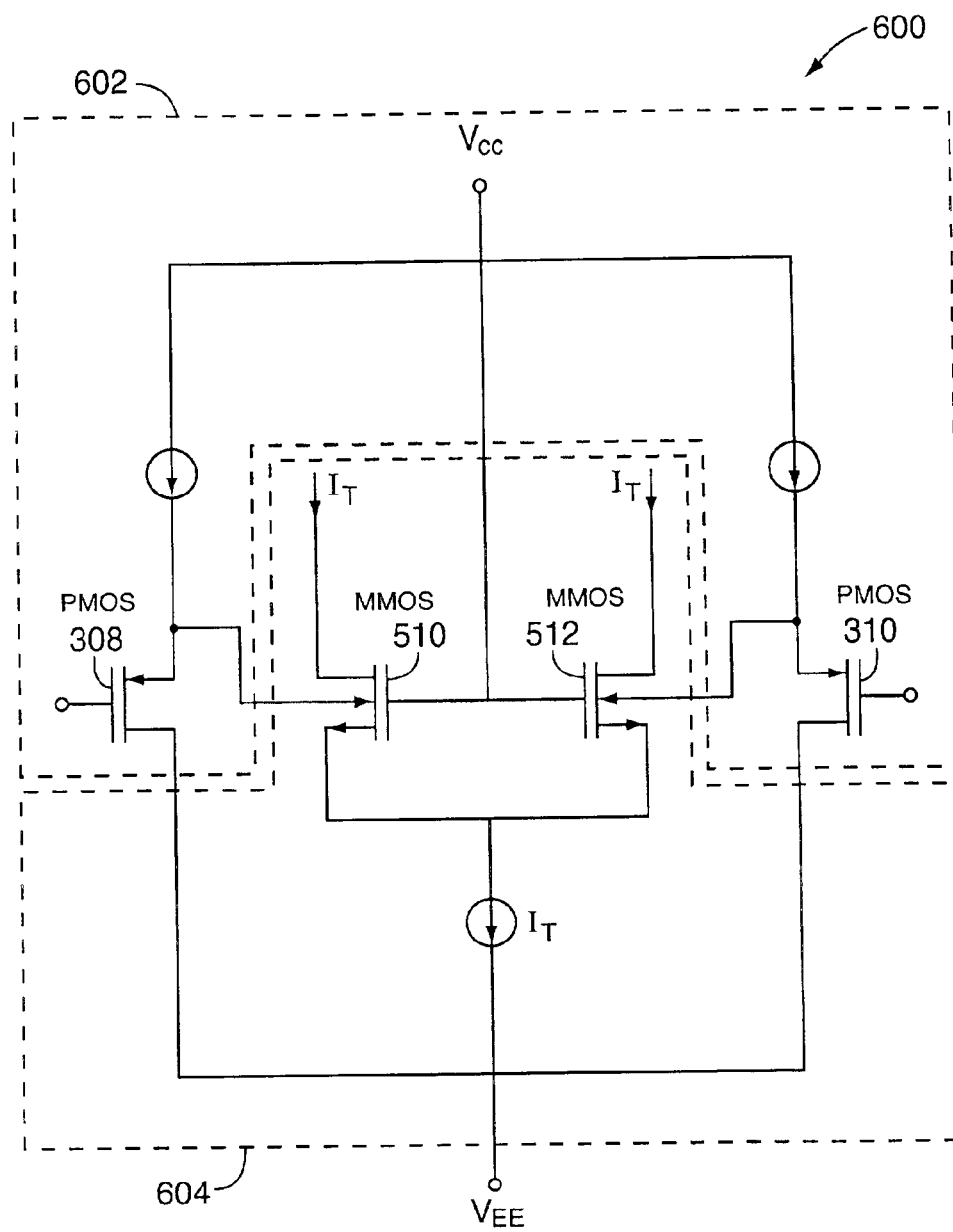
FIG. 6B is a schematic diagram of a low voltage rail-to-rail CMOS input stage, in accordance with another embodiment of the present invention.

FIG. 6B is a schematic diagram of a low voltage rail-to-rail CMOS input stage 600, in accordance with another embodiment of the present invention. The embodiment in FIG. 6B is the dual of the embodiment of in FIG. 6A. The input stage 600 includes a voltage input network 602 and a transconductance network 604. The voltage input network 602 in FIG. 6B includes PMOS transistors 308 and 310. Also, the transconductance network 604 includes a differential NMOS transistor pair 510 and 512. As can be appreciated by those with skill in the art, the embodiment of FIG. 6B performs similar to the embodiment of FIG. 6A. In yet another embodiment, the PMOS transistors in FIG. 6B can be replaced with JFET transistors.

The choice between the embodiment in FIG. 6A and the embodiment in FIG. 6B essentially depends on the process being implemented. Depending on the process, one of the embodiments may be easier to implement. However, both will provide the essentially same function.

Figure 7:
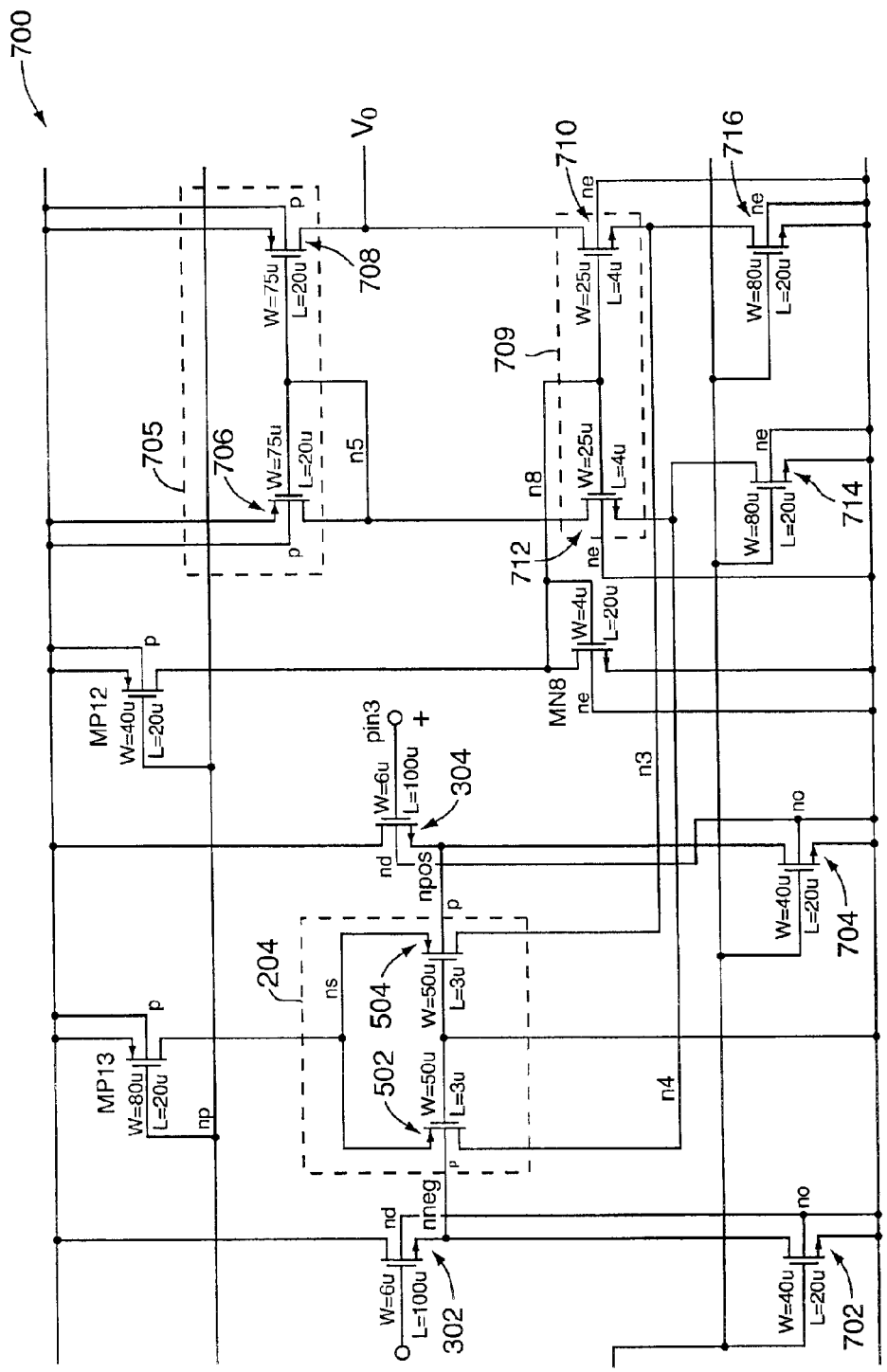
FIG. 7 is a schematic diagram showing a one volt rail-to-rail CMOS input stage, in accordance with another embodiment of the present invention.

FIG. 7 is a schematic diagram showing a one volt rail-to-rail CMOS input stage 700, in accordance with another embodiment of the present invention. The input stage 700 includes depletion-mode NMOS transistor 302, depletion-mode NMOS transistor 304, and a transconductance network 204. The drains of depletion-mode NMOS transistors 302 and 304 are coupled to $V_{CC}$ and the sources of depletion-mode NMOS transistors 302 and 304 are coupled to the transconductance network 204. Finally, the differential input signal $V_{IN}$ is provided through the gates of depletion-mode NMOS transistors 302 and 304.

In use, the depletion-mode NMOS transistors 302 and 304 are used as source follower devices to drive the transconductance network 204. Advantageously, the depletion-mode NMOS transistors 302 and 304 have a source potential greater than $V_{EE}$ when their gate voltages are equal to $V_{EE}$. Moreover, when the gate voltages of the depletion-mode NMOS transistors 302 and 304 transitions to near $V_{CC}$, the back-gate effect on these transistors causes their threshold voltages to become positive, thus making their source voltages less than their gate voltages. This property of the depletion-mode NMOS transistors 302 and 304 allows the input stage of the present invention to operate at essentially rail-to-rail.

The transconductance network 204 includes a differential PMOS transistor pair 502 and 504. The gates of PMOS transistors 502 and 504 are coupled to the ground reference $V_{EE}$, and the sources of PMOS transistors 502 and 504, are coupled to current source 506. The drains of PMOS transistors 502 and 504 provide differential output current $I_O$ to the rest of the system, such as to an operational amplifier. Finally, the bulk terminal of PMOS transistor 502 is coupled to the source of depletion-mode NMOS transistor 302, and the bulk terminal of PMOS transistor 504 is coupled to the source of depletion-mode NMOS transistor 304.

Essentially, it is desirable to generate a current based on a differential input voltage over the entire common-mode range of the amplifier, including $V_{CC}$ and $V_{EE}$. The present invention addresses this by driving the bulk terminals of the differential pair PMOS transistors 502 and 504, and coupling their gates to the ground reference. Thus, in operation, the depletion-mode NMOS transistors 302 and 304 are utilized as source follower devices to drive the bulk terminals of PMOS transistors 502 and 504. By modulating the bulk voltages of PMOS transistors 502 and 504 via the source follower NMOS transistors 302 and 304, the channels of transistors 502 and 504 are sufficiently modulated to generate an input transconductance for the amplifier.

The bulk terminals of transistors 502 and 504 can be treated as another gate input to the PMOS transistor, thus, allowing the present invention to operate over the entire input common-mode range of $V_{CC}$ to $V_{EE}$. In the present invention, the range of voltages over which a current can be generated matches the input ranges of the depletion-mode transistors.

Since the bulk terminals of NMOS transistors 302 and 304 are coupled to $V_{EE}$, when the gate voltage of these transistors is at $V_{EE}$ the source voltage will be positive (i.e., above the gate). Moreover, when the gate voltage transistors 302 and 304 transitions to near $V_{CC}$, the back-gate effect on these transistors causes their threshold voltages to become positive, thus making their source voltages less than their gate voltages, as discussed previously with reference to FIG. 5.

The input stage 700 further includes NMOS transistors 702 and 704, which operate as current sources, a current mirror 705 having PMOS transistors 706 and 708, and a folded cascode 709 having NMOS transistors 710 and 712. In operation, the current mirror 705 is used to create a differential-to-single-ended conversion to the output $V_O$, where transistors 714 and 716 act as current sources. The current from the transconductance network 204 subtracts from the drain currents of transistors 714 and 716. The differential current is then applied to the folded cascode 709, where the current from transistor 712 is replicated by the current mirror 705, and compared to the current in transistor 710 at the output $V_O$.

While the present invention has been described in terms of several preferred embodiments, there are many alterations, permutations, and equivalents which may fall within the scope of this invention. It should also be noted that there are many alternative ways of implementing the systems and apparatuses of the present invention. It is therefore intended that the following appended claims be interpreted as including all such alterations, permutations, and equivalents as fall within the true spirit and scope of the present invention.

What is claimed is:

1. A low voltage operational amplifier input stage, the input stage comprising:
   a differential pair of P-channel metal oxide semiconductor field effect (PMOS) transistors, wherein the PMOS transistors produce a first and second current signal;
   a pair of N-channel depletion-mode metal oxide semiconductor field effect (NMOS) transistors coupled with the differential pair of PMOS transistors for receiving an input signal and for acting as source follower devices; and
   wherein each PMOS transistor has a bulk terminal, and wherein the pair of N-channel depletion mode metal oxide semiconductor field effect (NMOS) transistors is coupled to the bulk terminals of the differential pair of PMOS transistors, and act as source follower devices to drive the bulk terminals of the differential pair of PMOS transistors.

2. An input stage as recited in claim 1, wherein the input signal is a differential input signal that is coupled to gate terminals of the depletion-mode NMOS transistors.

3. An input stage as recited in claim 1, wherein gate terminals of the differential pair of PMOS transistors are coupled to ground, and wherein source terminals of the differential pair of PMOS transistors are coupled to a current source.

4. An input stage as recited in claim 1, wherein the bulk terminals of the depletion-mode NMOS transistors are coupled to ground reference, and the drain terminals of the depletion-mode NMOS transistors are coupled to $V_{CC}$.

5. An input stage as recited in claim 4, wherein the source terminals of the depletion-mode NMOS transistors are coupled to the bulk terminals of the differential pair of PMOS transistors.

6. An input stage as recited in claim 1, wherein the source terminal of each of the depletion-mode NMOS transistors has a voltage greater than $V_{EE}$ when the gate voltage of each of the depletion-mode NMOS transistors has a voltage equal to $V_{EE}$.

7. An input stage as recited in claim 5, wherein the source terminals of each of the depletion-mode NMOS transistors has a voltage less than $V_{CC}$ when the gate voltage of each of the depletion-mode NMOS transistors has a voltage equal to $V_{CC}$.

8. A method for providing an output signal from in input stage of a low voltage operational amplifier, the method comprising the operations of:
   providing an input signal to a pair of N-channel depletion-mode metal oxide semiconductor field effect (NMOS) transistors coupled to bulk terminals of a differential pair of P-channel metal oxide semiconductor field effect (PMOS) transistors, such that said NMOS transistors act as a source follower.

9. A method as recited in claim 8, wherein the operation of providing an input signal to the depletion-mode NMOS transistors includes applying a differential input signal to gate terminals of the depletion-mode NMOS transistors.

10. A method as recited in claim 9, wherein gate terminals of the differential pair of PMOS transistors are coupled to ground, and wherein source terminals the differential pair of PMOS transistors are coupled to a current source.

11. A method as recited in claim 8, wherein the bulk terminals of the depletion-mode NMOS transistors are coupled to $V_{EE}$, and the drain terminals of the depletion NMOS transistors are coupled to $V_{CC}$.

12. A method as recited in claim 11, wherein the source terminals of the depletion-mode NMOS transistors are coupled to the bulk terminals of the differential pair of PMOS transistors.

13. A method as recited in claim 8, wherein the source terminal of each of the depletion-mode NMOS transistors has a voltage greater than $V_{EE}$ when the gate voltage of each of the depletion-mode NMOS transistors has a voltage equal to $V_{EE}$.

14. A method as recited in claim 8, wherein the source terminal of each of the depletion-mode NMOS transistors has a voltage less than $V_{CC}$ when the gate voltage of each of the depletion mode NMOS transistors has a voltage equal to $V_{CC}$.

15. An application specific integrated circuit (ASIC) comprising:
   a differential pair of P-channel metal oxide semiconductor field effect (PMOS) transistors, each PMOS transistor having a bulk terminal, wherein the PMOS transistors are operative to produce a differential current signal; and
   a pair of N-channel depletion-mode metal oxide semiconductor field effect (NMOS) transistors, coupled to the bulk terminals of the differential pair of PMOS transistors, for receiving an input signal and for acting as source follower devices to drive the differential pair of PMOS transistors.

16. An ASIC as recited in claim 15, wherein the input signal is a differential input signal that is coupled to gate terminals of the depletion-mode NMOS transistors.

17. An ASIC as recited in claim 15, wherein gate terminals of the differential pair of PMOS transistors are coupled to $V_{EE}$, and wherein source terminals the differential pair of PMOS transistors are coupled to a current source.

18. An ASIC as recited in claim 15, wherein the source terminal of each of the depletion-mode NMOS transistors has a voltage greater than $V_{EE}$ when the gate voltage of each of the depletion-mode NMOS transistors has a voltage equal to $V_{EE}$.

19. An ASIC as recited in claim 18, wherein the source terminal of each of the differential pair of depletion-mode NMOS transistors has a voltage less than $V_{CC}$ when the gate voltage of each of the differential pair of depletion-mode NMOS transistors has a voltage equal to $V_{CC}$.

20. An operational amplifier input stage, the input stage comprising:
   a voltage input network, wherein the voltage input network receives a differential input signal, and wherein the voltage input network provides a voltage input network output signal;
   a transconductance network, wherein the transconductance network receives the voltage input network output signal, and wherein the transconductance network provides a differential output signal;
   wherein the voltage input network is operative to act as a source follower device and drive the transconductance network; and
   wherein the voltage input network includes a pair of depletion-mode NMOS transistors.

21. An operational amplifier input stage, the input stage comprising:
   a voltage input network, wherein the voltage input network receives a differential input signal, and wherein the voltage input network provides a voltage input network output signal, the voltage input output signal being above the $V_{EE}$ when the differential input signal is at $V_{EE}$ and wherein the voltage input network includes a pair of depletion-mode NMOS transistors;
   an transconductance network, wherein the transconductance network receives the voltage input network output signal, and wherein the transconductance network provides a differential output signal and wherein the transconductance network includes a differential pair of PMOS transistors, each PMOS transistor having a bulk terminal; and
   wherein the voltage input network is operative to act as a source follower device and drive the transconductance network.

22. An operational amplifier input stage as recited in claim 21, wherein the depletion-mode NMOS transistors drive the bulk terminals of the differential pair of PMOS transistors.

23. An operational amplifier input stage as recited in claim 20, wherein a source terminal of each of the depletion-mode NMOS transistors has a voltage greater than $V_{EE}$ when a gate voltage of each of the depletion-mode NMOS transistors has a voltage equal to $V_{EE}$.

24. An operational amplifier input stage as recited in claim 23, wherein the source terminal of each of the depletion-mode NMOS transistors has a voltage less than $V_{CC}$ when the gate voltage of each of the depletion-mode NMOS transistors has a voltage equal to $V_{CC}$.

25. An operational amplifier capable of operating on low supply voltages, the operational amplifier comprising:
   an input stage having a differential pair of PMOS transistors, and
   an output stage, wherein each the PMOS transistor includes a bulk terminal, and wherein the differential pair of PMOS transistors produces a differential output signal, and wherein the NMOS transistors are depletion-mode NMOS transistors, and wherein the of depletion-mode NMOS transistors are coupled to the bulk terminals of the differential pair of PMOS transistors.

26. An operational amplifier as recited in claim 25, wherein the depletion-mode NMOS transistors receive a differential input signal using the gate terminals of the NMOS transistors.

27. An operational amplifier as recited in claim 25, wherein the PMOS transistors are coupled to a folded cascode circuit.

28. An operational amplifier as recited in claim 27, wherein the folded cascode circuit includes a pair of NMOS transistors.

29. A low voltage operational amplifier input stage, the input stage comprising:
   a plurality of N-channel metal oxide semiconductor field effect (NMOS) transistors, each NMOS transistor having a bulk terminal, for producing a first and a second current signal; and
   a plurality of P-channel depletion-mode metal oxide semiconductor field effect (PMOS) transistors, coupled to each bulk terminal of the plurality of NMOS transistors, for acting as source follower devices to drive the plurality of NMOS transistors.

30. An input stage as recited in claim 29, wherein the input signal is a differential input signal that is coupled to gate terminals of the depletion-mode PMOS transistors.

31. A low voltage operational amplifier input stage, the input stage comprising:
   a plurality of N-channel metal oxide semiconductor field effect (NMOS) transistors for producing a first and a second current signal wherein gate terminals of the NMOS transistors are coupled to $V_{CC}$; and
   a plurality of P-channel depletion-mode metal oxide semiconductor field effect (PMOS) transistors for acting as source follower devices to drive the plurality of NMOS transistors, and wherein source terminals of the PMOS transistors are coupled to a current source.

32. A low voltage operational amplifier input stage, the input stage comprising:
   a plurality of N-channel metal oxide semiconductor field effect (NMOS) transistors for producing a first and a second current signal; and
   a plurality of P-channel depletion-mode metal oxide semiconductor field effect (PMOS) transistors for acting as source follower devices to drive the plurality of NMOS transistors signal wherein the drain terminals of the depletion-mode PMOS transistors are coupled to $V_{EE}$.

33. An input stage as recited in claim 32, wherein the source terminals of the depletion-mode PMOS transistors are coupled to bulk terminals of the NMOS transistors.

34. A low voltage operational amplifier input stage, the input stage comprising:
   a differential pair of first transistors, each transistor having a bulk terminal, operative to produce a first and a second current signal; and a pair of second transistors, coupled to the bulk terminals of the differential pair of first transistors, for receiving an input signal and for acting as source follower devices to drive the differential pair of first transistors.

35. The apparatus of claim 34, wherein said first transistors are chosen from the group consisting essentially of JFET transistors, NMOS transistors and PMOS transistors, and wherein said second transistors are chosen from the group consisting essentially of JFET transistors, NMOS transistors and PMOS transistors.

36. An operational amplifier input stage, the input stage comprising:

a transconductance network, having a plurality of bulk terminals, for providing a current output signal in response to a voltage output signal; and a voltage input network, coupled to the plurality of bulk terminals, for providing the voltage output signal, wherein the voltage input network is operative to act as a source follower device and drive the transconductance network.

37. The operational amplifier input stage of claim 36, wherein the transconductance cicuit is coupled to a folded cascode circuit.

* * * * *